(12) United States Patent
Sperschneider et al.

(10) Patent No.: US 9,043,200 B2
(45) Date of Patent: May 26, 2015

(54) ADAPTIVE GROUPING OF PARAMETERS FOR ENHANCED CODING EFFICIENCY

(75) Inventors: Ralph Sperschneider, Erlangen (DE); Jürgen Herre, Buckenhof (DE); Karsten Linzmeier, Erlangen (DE); Johannes Hilpert, Nürnberg (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 1011 days.

(21) Appl. No.: 12/948,417

(22) Filed: Nov. 17, 2010

(65) Prior Publication Data

US 2011/0060598 A1    Mar. 10, 2011

Related U.S. Application Data

(62) Division of application No. 11/243,915, filed on Oct. 5, 2005, now Pat. No. 7,991,610.

(51) Int. Cl.
*G10L 19/00* (2013.01)
*G10L 21/00* (2013.01)
(Continued)

(52) U.S. Cl.
CPC ............. *H03M 7/40* (2013.01); *G10L 19/0204* (2013.01); *G10L 19/0017* (2013.01);
(Continued)

(58) Field of Classification Search
CPC ...... H04N 7/50; H04N 7/5013; G10L 19/008; G10L 19/022; G10L 19/025; G10L 19/0017; G10L 19/0204; G10L 25/18
USPC ....................... 704/500; 341/50–67; 375/240
See application file for complete search history.

(56) References Cited

U.S. PATENT DOCUMENTS

| 5,325,091 A | 6/1994 | Kaplan et al. |
| 5,528,628 A | 6/1996 | Park et al. |

(Continued)

FOREIGN PATENT DOCUMENTS

| CN | 1158050 A | 8/1997 |
| EP | 0782341 A2 | 7/1997 |

(Continued)

OTHER PUBLICATIONS

Disch, et al; "Spatial Audio Coding: Next-Generation Efficient and Compatible Coding of Multi-Channel Audio", AES Convention: 117, Oct. 2004, Paper No. 6186.

(Continued)

*Primary Examiner* — Matthew Baker
(74) *Attorney, Agent, or Firm* — Laurence A. Greenberg; Werner H. Stemer; Ralph E. Locher (57) ABSTRACT

The present invention is based on the finding that parameters including: a first set of parameters of a representation of a first portion of an original signal and a second set of parameters of a representation of a second portion of the original signal can be efficiently encoded when the parameters are arranged in a first sequence of tuples and a second sequence of tuples. The first sequence of tuples includes tuples of parameters having two parameters from a single portion of the original signal and the second sequence of tuples includes tuples of parameters having one parameter from the first portion and one parameter from the second portion of the original signal. A bit estimator estimates the number of necessary bits to encode the first and the second sequence of tuples. Only the sequence of tuples, which results in the lower number of bits, is encoded.

31 Claims, 6 Drawing Sheets

(51) Int. Cl.

| | | |
|---|---|---|
| *G06K 9/36* | (2006.01) | |
| *H03K 7/00* | (2006.01) | |
| *H03M 7/40* | (2006.01) | |
| *G10L 19/008* | (2013.01) | |
| *H04N 19/196* | (2014.01) | |
| *H04N 19/15* | (2014.01) | |
| *H04N 19/12* | (2014.01) | |
| *H04N 19/463* | (2014.01) | |
| *H04N 19/91* | (2014.01) | |
| *G10L 19/02* | (2013.01) | |
| *G10L 19/002* | (2013.01) | |
| *G10L 25/18* | (2013.01) | |

(52) U.S. Cl.
CPC ............. *G10L 19/002* (2013.01); *G10L 25/18* (2013.01); *G10L 19/008* (2013.01); *H04N 19/196* (2014.11); *H04N 19/15* (2014.11); *H04N 19/12* (2014.11); *H04N 19/463* (2014.11); *H04N 19/91* (2014.11)

(56) References Cited

U.S. PATENT DOCUMENTS

| | | |
|---|---|---|
| 5,532,694 A | 7/1996 | Mayers et al. |
| 5,550,540 A | 8/1996 | Furlan et al. |
| 5,550,541 A | 8/1996 | Todd |
| 5,717,394 A | 2/1998 | Schwartz et al. |
| 5,721,720 A | 2/1998 | Kikuchi et al. |
| 5,845,243 A | 12/1998 | Smart et al. |
| 6,064,954 A | 5/2000 | Cohen et al. |
| 6,166,664 A | 12/2000 | Acharya |
| 6,237,496 B1 | 5/2001 | Abbott |
| 6,438,525 B1 | 8/2002 | Park |
| 6,484,142 B1 | 11/2002 | Miyasaka et al. |
| 6,546,049 B1 | 4/2003 | Lee |
| 6,675,148 B2 | 1/2004 | Hardwick |
| 6,813,438 B1 | 11/2004 | Bates et al. |
| 6,862,278 B1 | 3/2005 | Chang et al. |
| 6,978,236 B1 | 12/2005 | Lijeryd et al. |
| 7,006,636 B2 | 2/2006 | Baumgarte et al. |
| 7,039,204 B2 | 5/2006 | Baumgarte et al. |
| 7,088,868 B1 | 8/2006 | Lidman |
| 7,116,787 B2 | 10/2006 | Faller et al. |
| 7,161,507 B2 | 1/2007 | Tomic |
| 7,200,275 B2 | 4/2007 | Srinivasen et al. |
| 7,292,901 B2 | 11/2007 | Baumgarte et al. |
| 7,376,555 B2 | 5/2008 | Schuijers et al. |
| 7,411,524 B2 | 8/2008 | Tropf |
| 7,426,462 B2 | 9/2008 | Young et al. |
| 7,433,824 B2 | 10/2008 | Mehrotra et al. |
| 7,502,743 B2 | 3/2009 | Thumpudi et al. |
| 7,583,805 B2 | 9/2009 | Baumgarte et al. |
| 7,617,166 B2 | 11/2009 | Haudrich et al. |
| 7,644,003 B2 | 1/2010 | Baumgarte et al. |
| 7,663,513 B2 | 2/2010 | Pang et al. |
| 7,693,721 B2 | 4/2010 | Baumgarte et al. |
| 8,930,202 B2 * | 1/2015 | Multrus et al. ............... 704/501 |
| 2003/0026441 A1 | 2/2003 | Faller |
| 2003/0035553 A1 | 2/2003 | Baumgarte et al. |
| 2003/0081685 A1 | 5/2003 | Montgomery |
| 2003/0219130 A1 | 11/2003 | Baumgarte et al. |
| 2003/0235317 A1 | 12/2003 | Baumgarte et al. |
| 2003/0236583 A1 | 12/2003 | Baumgarte et al. |
| 2004/0049379 A1 | 3/2004 | Thumpudi et al. |
| 2004/0056783 A1 | 3/2004 | Fallon |
| 2005/0058304 A1 | 3/2005 | Baumgarte et al. |
| 2005/0180579 A1 | 8/2005 | Baumgarte et al. |
| 2005/0216262 A1 | 9/2005 | Fejzo |
| 2005/0246178 A1 | 11/2005 | Fejzo |
| 2005/0267763 A1 * | 12/2005 | Ojanpera .................... 704/500 |
| 2007/0003069 A1 | 1/2007 | Faller |
| 2008/0091439 A1 | 4/2008 | Baumgarte et al. |
| 2009/0319281 A1 | 12/2009 | Baumgarte et al. |

FOREIGN PATENT DOCUMENTS

| | | |
|---|---|---|
| EP | 0782341 A3 | 5/1999 |
| EP | 1047198 A2 | 10/2000 |
| EP | 1107232 A2 | 6/2001 |
| EP | 1047198 A3 | 1/2004 |
| JP | 63284974 A | 11/1988 |
| JP | 3108824 A | 5/1991 |
| JP | 7203441 A | 8/1995 |
| JP | 9511372 T | 11/1997 |
| JP | 2001151413 A | 5/2000 |
| JP | 2001209399 A | 8/2001 |
| JP | 2001339311 A | 12/2001 |
| JP | 2003153265 A | 5/2003 |
| JP | 2004078183 A | 3/2004 |
| JP | 2004246224 A | 9/2004 |
| RU | 2117388 C1 | 8/1998 |
| RU | 2158487 C2 | 10/2000 |
| RU | 2159507 C1 | 11/2000 |
| RU | 2214047 C2 | 10/2003 |
| SU | 1711331 A1 | 2/1992 |
| TW | 156505 | 7/1999 |
| TW | 365088 | 7/1999 |
| TW | 437187 B | 5/2001 |
| WO | 9527337 A1 | 10/1995 |
| WO | 0045378 A2 | 8/2000 |

OTHER PUBLICATIONS

English translation of Japanese Office Action dated Aug. 3, 2010.
ISO/IEC 13818-7: 1997 (E), pp. 28, 40-44, published in 1997.
English translation of Russian Decision on Grant received Sep. 8, 2009.
Chinese Office Action dated May 15, 2009.
Australian Office Action dated Apr. 16, 2009.
Taiwanese Office Action dated Jul. 7, 2009.
Pattichis, et al; "On the Representation of Wideband Images Using Permutations for Lossless Coding", Proceedings of the 4th IEEE Southwest Symposium on Image Analysis and Interpretation, Apr. 2, 2002, pp. 237-241, XP 010378666.
Vasilache, et al; "Indexing and Entropy Coding of Lattice Codevectors", 2001 IEEE International Conference on Acoustics, Speech, and Signal Processing Proceesings (ICASSP), Salt Lake City, UT, May 7-11, 2001, IEEE International Conference on Acoustics, Speech and Signal Processing (ICASSP), New York, NY, IEEE, US vol. 1 of 6, May 7, 2001, pp. 2605-2608.
Quackenbusch, et al; "Noiseless Coding of Quantized Spectral Components in MPEG-2 Advanced Audio Coding", IEEE ASSP Workshop on Applications of Signal Processing to Audio and Acoustics, Oct. 19, 1997, XP002135840.
Patrik, et al; "Indexing Algorithms for Zn, An, Dn and Dn++ Lattice Vector Quantizers", IEEE Transactions on Multimedia, IEEE Service Center, Piscataway, NY, US vol. 3, No. 4, Dec. 2001 XP 011036260.
International Search Report and Written Opinion dated Jun. 23, 2006.
Gonzalez, et al: "Digital Image Processing", International Edition, Second Edition, published in 2002, Chapter 8, pp. 430-432, pp. 440-442, p. 458 and 499.
Faller, et al; "Binaural Cue Coding Applied to Stereo and Multi-Channel Audio Compression", 112th AES Convention paper 5574, May 10-13, 2002, Munich, Germany, pp. 1-9.
Faller, et al; "Binaural Cue Coding Applied to Audio Compression with Flexible Rendering", 113th AES Convention Paper 5686, Oct. 5-8, 2002, Los Angeles, CA, pp. 1-10.
Breebaart, et al; "High-Quality Parametric Spatial Audio Coding at Low Bitrates", 116th AES Convention Paper 6072, May 8-11, 2004, Berlin, Germany, pp. 1-13.
Schuijers, et al; "Low Complexity Parametric Stereo Coding", 116th AES Convention Paper 6073, May 8-11, 2004, Berlin, Germany, pp. 1-11.
Faller, et al; "Efficient Representation of Spatial Audio Using Perceptual Parametrization", IEEE Workshop on Applications of Signal Processing to Audio and Acoustics, Oct. 21-24, 2001, New Paltz, New York, pp. 199-202.

(56) References Cited

OTHER PUBLICATIONS

Bosi, et al; "ISO/IEC MPEG-2 Advanced Audio Coding", Journal of the Audio Engineering Society, New York, NY, US, vol. 45, No. 10, Oct. 1997, pp. 789-812.
Shen-Chuan Tai, et al; "An Adaptive 3-D Discrete Cosine Transform Coder for medical Image Compression", IEEE Transactions on Information Technology in Biomedicine IEEE USA, vol. 4, No. 3, Sep. 2000, pp. 259-263.
Faller, et al; "Binaural Cue Coding—Part II: Schemes and Applications", IEEE Transactions on Speech and Audio Processing, IEEE Service Center, New York, NY, US, vol. 11, No. 6, Nov. 2003, pp. 520-531.
Yamaguchi, et al; "An Efficient Method for Compressing Test Data", Proceedings of the International Test Conference ITC '97, Washington DC, Nov. 1-6, 1997, International Test Conference, New York, NY, US, IEEE vol. Conf. 28, Nov. 1, 1997, pp. 79-88.
Bell, et al; "Modeling for Text Compression", ACM Computing Surveys, New York, NY, US, vol. 21, No. 4, Dec. 1989, pp. 557-591.
Tavakoli, et al; "Lossless Compression of Medical Images", Computer-Based Medical Systems, 1991, Proceedings of the 4th Annual IEEE Symposium, Baltimore, MD, US, May 12-14, 1991, Los Alamitos, CA, US, IEEE Comput. Soc., US, May 12, 1991, pp. 200-207.
Information Technology—Coding of Moving Pictures and Associated Audio for Digital Storage Media and up to about 1,5-MBIT/S—Part 3: Audio; International Standard ISO/IEC, XX, XX, No. 11172-3, Aug. 1, 1993, pp. 1-158.
Russian Decision of Grant dated Apr. 21, 2009.
Russian Decision on Grant dated Apr. 9, 2009.
Taiwanese Office Action dated Oct. 31, 2008.
Bardeli et al., "Robust Identification of Time-Scaled Audio", Proceedings of the AES 25th International Conference, London, United Kingdom, Jun. 17-19, 2004, pp. 1-12.

* cited by examiner

ADAPTIVE GROUPING OF PARAMETERS FOR ENHANCED CODING EFFICIENCY

CROSS-REFERENCE TO RELATED APPLICATION

This is a divisional application of application Ser. No. 11/243,915, filed Oct. 5, 2005; which was a non-provisional of U.S. provisional application No. 60/670,993, filed Apr. 13, 2005; the prior applications are herewith incorporated by reference in their entirety.

BACKGROUND OF THE INVENTION

Field of the Invention

The present invention relates to lossless encoding of parameters, and, in particular, to the generation and use of an encoding rule for efficient compression of parameters.

In recent times, the multi-channel audio reproduction technique is becoming more and more important. This may be due to the fact that audio compression/encoding techniques such as the well-known mp3 technique have made it possible to distribute audio records via the Internet or other transmission channels having a limited bandwidth. The mp3 coding technique has become so famous because of the fact that it allows distribution of all the records in a stereo format, i.e., a digital representation of the audio record including a first or left stereo channel and a second or right stereo channel.

Nevertheless, there are basic shortcomings of conventional two-channel sound systems. Therefore, the surround technique has been developed. A recommended multi-channel-surround representation includes, in addition to the two stereo channels L and R, an additional center channel C and two surround channels Ls, Rs. This reference sound format is also referred to as three/two-stereo, which means three front channels and two surround channels. Generally, five transmission channels are required. In a playback environment, at least five speakers at five decent places are needed to get an optimum sweet spot in a certain distance of the five well-placed loudspeakers.

Several techniques are known in the art for reducing the amount of data required for transmission of a multi-channel audio signal. Such techniques are called joint stereo techniques. To this end, reference is made to FIG. 9, which shows a joint stereo device 60. This device can be a device implementing e.g. intensity stereo (IS) or binaural cue coding (BCC). Such a device generally receives—as an input—at least two channels (CH1, CH2, ... CHn), and outputs at least a single carrier channel and parametric data. The parametric data are defined such that, in a decoder, an approximation of an original channel (CH1, CH2, ... CHn) can be calculated.

Normally, the carrier channel will include subband samples, spectral coefficients, time domain samples etc., which provide a comparatively fine representation of the underlying signal, while the parametric data do not include such samples of spectral coefficients but include control parameters for controlling a certain reconstruction algorithm such as weighting by multiplication, time shifting, frequency shifting, phase shifting, etc. The parametric data, therefore, include only a comparatively coarse representation of the signal or the associated channel. Stated in numbers, the amount of data required by a carrier channel will be in the range of 60-70 kbit/s, while the amount of data required by parametric side information for one channel will typically be in the range of 1.5-2.5 kbit/s. An example for parametric data are the well-known scale factors, intensity stereo information or binaural cue parameters as will be described below.

The BCC Technique is for example described in the AES convention paper 5574, "Binaural Cue Coding applied to Stereo and Multi-Channel Audio Compression", C. Faller, F. Baumgarte, May 2002, Munich, in the IEEE WASPAA Paper "Efficient representation of spatial audio using perceptual parametrization", October 2001, Mohonk, N.Y., in "Binaural cue coding applied to audio compression with flexible rendering", C. Faller and F. Baumgarte, AES $113^{th}$ Convention, Los Angeles, Preprint 5686, October 2002 and in "Binaural cue coding—Part II: Schemes and applications", C. Faller and F. Baumgarte, IEEE Trans. on Speech and Audio Proc., volume level. 11, no. 6, November 2003.

In BCC encoding, a number of audio input channels are converted to a spectral representation using a DFT (Discrete Fourier Transform) based transform with overlapping windows. The resulting uniform spectrum is divided into non-overlapping partitions. Each partition approximately has a bandwidth proportional to the equivalent rectangular bandwidth (ERB). The BCC parameters are then estimated between two channels for each partition. These BCC parameters are normally given for each channel with respect to a reference channel and are furthermore quantized. The transmitted parameters are finally calculated in accordance with prescribed formulas (encoded), which may also depend on the specific partitions of the signal to be processed.

A number of BCC parameters do exist. The ICLD parameter, for example, describes the difference (ratio) of the energies contained in 2 compared channels. The ICC parameter (inter-channel coherence/correlation) describes the correlation between the two channels, which can be understood as the similarity of the waveforms of the two channels. The ICTD parameter (inter-channel time difference) describes a global time shift between the 2 channels whereas the IPD parameter (inter-channel phase difference) describes the same with respect to the phases of the signals.

One should be aware that, in a frame-wise processing of an audio signal, the BCC analysis is also performed frame-wise, i.e. time-varying, and also frequency-wise. This means that, for each spectral band, the BCC parameters are individually obtained. This further means that, in case a audio filter bank decomposes the input signal into for example 32 band pass signals, a BCC analysis block obtains a set of BCC parameters for each of the 32 bands.

A related technique, also known as parametric stereo, is described in J. Breebaart, S. van de Par, A. Kohlrausch, E. Schuijers, "High-Quality Parametric Spatial Audio Coding at Low Bitrates", AES 116th Convention, Berlin, Preprint 6072, May 2004, and E. Schuijers, J. Breebaart, H. Pumhagen, J. Engdegard, "Low Complexity Parametric Stereo Coding", AES 116th Convention, Berlin, Preprint 6073, May 2004.

Summarizing, recent approaches for parametric coding of multi-channel audio signals ("Spatial Audio Coding", "Binaural Cue Coding" (BCC) etc.) represent a multi-channel audio signal by means of a downmix signal (could be monophonic or comprise several channels) and parametric side information ("spatial cues") characterizing its perceived spatial sound stage. It is desirable to keep the rate of side information as low as possible in order to minimize overhead information and leave as much of the available transmission capacity for the coding of the downmix signals.

One way to keep the bit rate of the side information low is to losslessly encode the side information of a spatial audio scheme by applying, for example, entropy coding algorithms to the side information.

Lossless coding has been extensively applied in general audio coding in order to ensure an optimally compact representation for quantized spectral coefficients and other side information. Examples for appropriate encoding schemes and methods are given within the ISO/IEC standards MPEG1 part 3, MPEG2 part 7 and MPEG4 part 3.

These standards and, for example also the IEEE paper "Noiseless Coding of Quantized Spectral Coefficients in MPEG-2 Advanced Audio Coding", S. R. Quackenbush, J. D. Johnston, IEEE WASPAA, Mohonk, N.Y., October 1997 describes state of the art techniques that include the following measures to losslessly encode quantized parameters:

Multi-dimensional Huffman Coding of quantized spectral coefficients

Using a common (multi-dimensional) Huffman Codebook for sets of coefficients

Coding the value either as a hole or coding sign information and magnitude information separately (i.e. have only Huffman codebook entries for a given absolute value which reduces the necessary codebook size, "signed" vs. "unsigned" codebooks)

Using alternative codebooks of different largest absolute values (LAVs), i.e. different maximum absolute values within the parameters to be encoded Using alternative codebooks of different statistical distribution for each LAV Transmitting the choice of Huffman codebook as side information to the decoder Using "sections" to define the range of application of each selected Huffman codebook Differential encoding of scalefactors over frequency and subsequent Huffman coding of the result Another technique for the lossless encoding of coarsely quantized values into a single PCM code is proposed within the MPEG1 audio standard (called grouping within the standard and used for layer 2). This is explained in more detail within the standard ISO/IEC 11172-3:93.

The publication "Binaural cue coding—Part II: Schemes and applications", C. Faller and F. Baumgarte, IEEE Trans. on Speech and Audio Proc., volume level. 11, no. 6, November 2003 gives some information on coding of BCC parameters. It is proposed, that quantized ICLD parameters are differentially encoded over frequency and the result is subsequently Huffman encoded (with a one-dimensional Huffman code)

over time and the result is subsequently Huffman encoded (with a one-dimensional Huffman code), and that finally, the more efficient variant is selected as the representation of an original audio signal.

As mentioned above, it has been proposed to optimize compression performance by applying differential coding over frequency and, alternatively, over time and select the more efficient variant. The selected variant is then signaled to a decoder via some side information.

There has been quite some effort made to reduce the size of a downmix audio channel and the corresponding side information. Nonetheless the achievable bit rates are still too high to allow for every possible application. For example, streaming of audio and video content to mobile phones requires the least possible bit rates and therefore a more efficient encoding of the content.

SUMMARY OF THE INVENTION

It is the object of the present invention to provide an improved coding concept achieving a lossless compression of parameter values with higher efficiency.

In accordance with the first aspect of the present invention, this object is achieved by a compression unit for compression of parameters, the parameters including a first set of parameters including a representation of a first portion of an original signal, the parameters further including a second set of parameters including a representation of a second portion of the original signal, the second portion neighboring the first portion, comprising: a supplier for supplying a first tuple and a second tuple, each tuple having at least two parameters, the first tuple having two parameters from the first set of parameters and the second tuple having one parameter from the first set of parameters and one parameter from the second set of parameters; a bit estimator for estimating a number of bits necessary to encode the sets of parameters using a first sequence of tuples including the first tuple and to encode the sets of parameters using a second sequence of tuples including the second tuple, based on an encoding rule; and a provider for providing encoded blocks, the provider being operative to provide the encoded blocks using the sequence of tuples resulting in a lower number of bits, and for providing a sequence indication indicating the sequence of tuples from which the encoded blocks are derived.

In accordance with the second aspect of the present invention, this object is achieved by a decoder for decoding encoded blocks of parameters, the parameters including a first set of parameters including a representation of a first portion of an original signal, the parameters further including a second set of parameters including a representation of a second portion of the original signal, the second portion neighboring the first portion, and for processing a sequence indication, comprising: a decompressor, the decompressor being operative to decompress, using a decoding rule depending on an encoding rule used for encoding sequences of tuples, an encoded block of parameters to derive a sequence of tuples of parameters, each tuple having at least two parameters; and a frame builder for receiving the sequence indication, the sequence indication indicating a used sequence of tuples from a number of different sequences underlying the encoded block, and for building the sets of parameters using the information of the used sequence of tuples.

In accordance with the third aspect of the present invention, this object is achieved by a method for compression of parameters, the parameters including a first set of parameters including a representation of a first portion of an original signal, the parameters further including a second set of parameters including a representation of a second portion of the original signal, the second portion neighboring the first portion.

In accordance with the fourth aspect of the present invention, this object is achieved by a computer program implementing the above method, when running on a computer.

In accordance with the fifth aspect of the present invention, this object is achieved by a method for decoding encoded blocks of parameters, the parameters including a first set of parameters including a representation of a first portion of an original signal, the parameters further including a second set of parameters including a representation of a second portion of the original signal, the second portion neighboring the first portion, and for processing a sequence indication.

In accordance with the sixth aspect of the present invention, this object is achieved by a computer program implementing the above method, when running on a computer.

In accordance with the seventh aspect of the present invention, this object is achieved by a compressed representation of parameters, the parameters including a first set of parameters including a representation of a first portion of an original signal, the parameters further including a second set of parameters including a representation of a second portion of the original signal, the second portion neighboring the first portion of the original signal, comprising: an encoded block of parameters representing a used sequence of tuples; and a sequence indication indicating the used sequence of tuples of a first or a second sequence underlying the encoded block of parameters, where the first sequence includes a first tuple having two parameters from the first set of parameters and where the second sequence includes a second tuple having one parameter from the first set of parameters and one parameter from the second set of parameters.

The present invention is based on the finding that parameters including a first set of parameters of a representation of a first portion of an original signal and including a second set of parameters of a representation of a second portion of the original signal can be efficiently encoded, when the parameters are arranged in a first sequence of tuples and in a second sequence of tuples, wherein the first sequence of tuples comprises tuples of parameters having two parameters from a single portion of the original signal and wherein the second sequence of tuples comprises tuples of parameters having one parameter from the first portion and one parameter from the second portion of the original signal. An efficient encoding can be achieved using a bit estimator to estimate the number of necessary bits to encode the first and the second sequence of tuples, wherein only the sequence of tuples is encoded, that results in the lower number of bits.

The basic principle therefore is, that one rearranges the parameters to be encoded, for example in time and in frequency, and finally uses the one arrangement (sequence of tuples) of the parameters for the compression, that results in the lower number of bits for the compressed parameters.

In one embodiment of the present invention, two sets of spectral parameters, describing the spectral representation of two consecutive time portions of an original signal are adaptively grouped in pairs of two parameters to enhance the coding efficiency. Therefore, on the one hand a sequence of tuples is generated using tuples of parameters consisting of two neighboring frequency parameters from the same time portion. On the other hand, a second sequence of tuples is generated using tuples, that are built using a first parameter from the first time portion and the corresponding parameter from the second time portion of the original signal. Then, both sequences of tuples are encoded using a two-dimensional Huffman code. The two encoded sequences of tuples are compared in their sizes and the tuple resulting in the lower number of bits is finally selected to be transmitted. The information, which kind of tuples has been used to build the encoded data is transmitted to a decoder as additional side information.

One advantage of the previously described inventive encoder is, that due to the grouping of parameters into tuples consisting of two parameters, a two-dimensional Huffman code can be applied for the compression, which generally results in a lower bit rate.

A second advantage is, that the adaptive grouping, i.e. the concept to dynamically decide between two possible grouping strategies during the encoding process, yields a further decrease in the bit rate of the side information.

Deciding between the two grouping strategies only once for a set of two consecutive frames additionally reduces the amount of required side information, since the indication, which grouping strategy has been used during the encoding, has to be transmitted only once for a set of two complete consecutive time frames.

In a further embodiment of the present invention an inventive compression unit additionally comprises a differential encoder, that differentially encodes the parameters either in time or in frequency prior to the adaptive grouping. That differential encoding together with the adaptive grouping and an appropriate Huffman codebook further reduces the size of the side information to be transmitted. The two differential encoding possibilities together with the two grouping strategies result in a total number of four possible combinations, further increasing the probability of finding an encoding rule, that results in a low side information bit rate.

In a further embodiment of the present invention, the inventive concept is used for a decompression unit, allowing to decode encoded blocks of parameters and to rebuild the original frames based on a side information signaling the grouping scheme underlying the encoded blocks of parameters. In an advantageous modification the inventive decoder also allows the decoding of data that has not been adaptively grouped, therefore a compatibility of the inventive decoder with existing equipment can be achieved.

Other features which are considered as characteristic for the invention are set forth in the appended claims.

Although the invention is illustrated and described herein as embodied in an adaptive grouping of parameters for enhanced coding efficiency, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
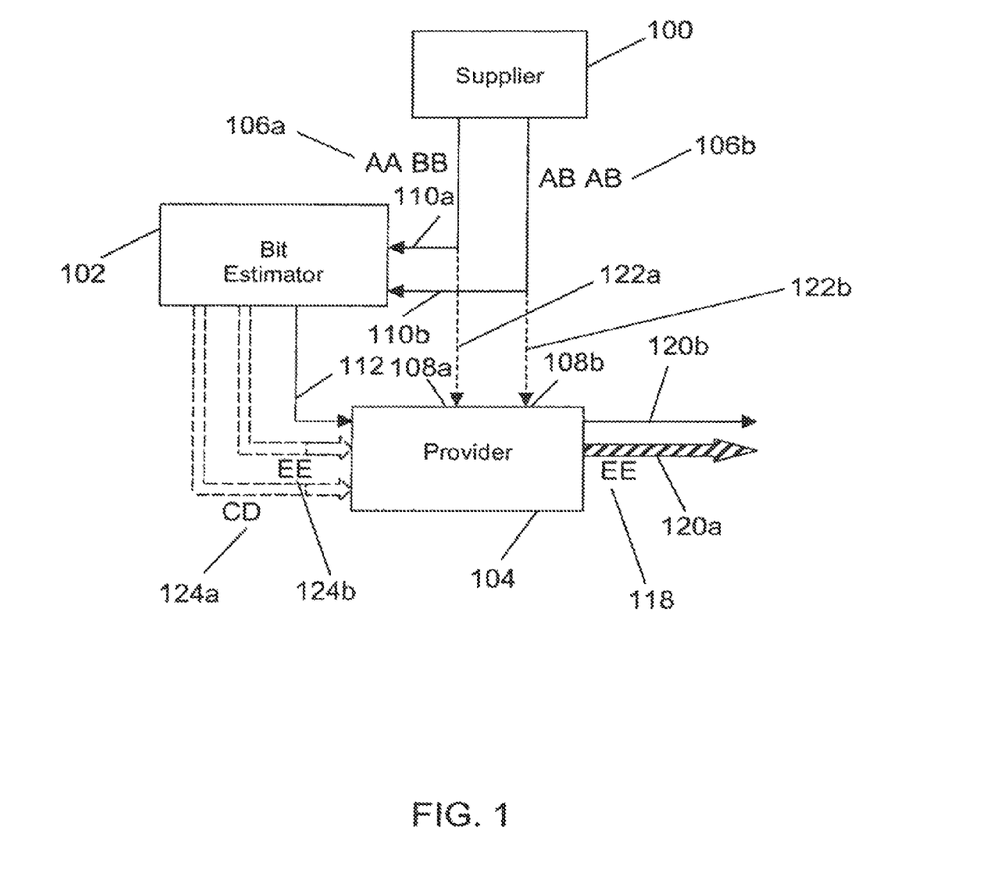
FIG. 1 shows an inventive compression unit.

FIG. 1 shows an inventive compression unit 90, comprising a supplier 100, a bit estimator 102 and a provider 104.

The supplier 100 supplies a first sequence of tuples 106a and a second sequence of tuples 106b at two data outputs. The provider 104 receives the tuples 106a and 106b on two of his data inputs 108a and 108b. The bit estimator receives the two tuples on his data inputs 110a and 110b.

The bit estimator 102 estimates the number of bits that result from applying an encoding rule to the two tuples 106a and 106b. The bit estimator 102 chooses the tuple resulting in the lower number of bits and signals via a signaling output 112a, whether the tuple 106a or 106b will result in the lower number of bits.

Based on the decision of the bit estimator 102, the tuple resulting in the lower number of bits is finally encoded into encoded blocks 118, that are provided via output 120a of the provider 104, wherein the provider further signals a sequence indication at his signaling line 120b, indicating what original sequence of tuples (106a or 106b) was encoded to derive the encoded blocks 118.

In an alternative embodiment, the same functionality can be achieved, when the dashed connections 122a and 122b between the supplier 100 and the provider 104 are omitted. In this alternative scenario the bit estimator 102 would encode the sequence of tuples 106a and 106b, and would transfer two different encoded blocks 124a and 124b to the provider 104, where the provider additionally signals from which of the original sequences of tuples 106a and 106b the encoded blocks 124a and 124b are derived. To this end, the signaling output 112a of the bit estimator 102 can be used or the signaling can be derived by the provider 104 implicitly.

In this alternative embodiment the provider 104 would simply forward the encoded block with the lower number of bits to its output 120a, additionally providing the sequence indication.

Figure 2:
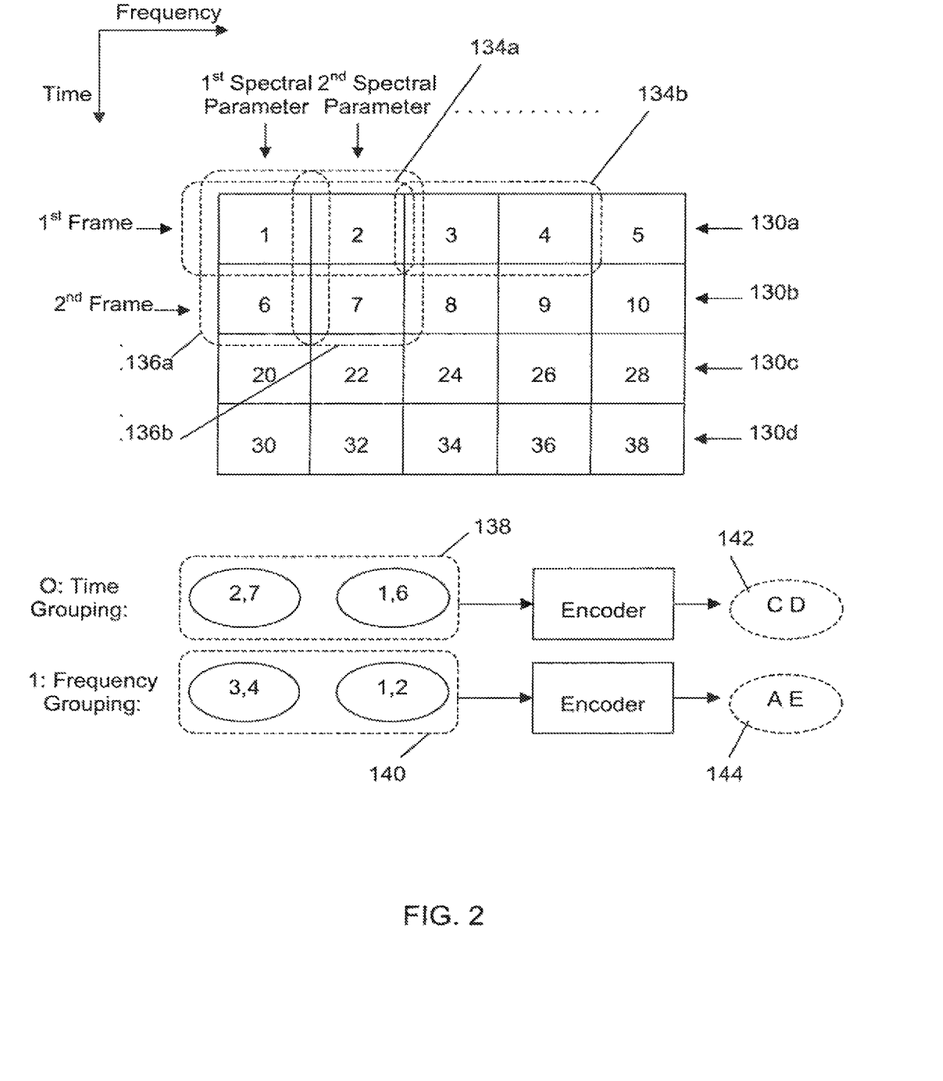
FIG. 2 shows two possibilities of adaptively grouping parameters.

FIG. 2 shows an example of two adaptive grouping schemes that are used to derive a sequence of tuples to be encoded. To explain the principle of the inventive adaptive grouping, four subsequent time frames 130a to 130d of an original signal are shown, wherein each of the frames is having a set of five spectral parameters 132a to 132e.

According to the present invention, the spectral parameters of two consecutive frames are grouped either in frequency, as illustrated by the tuples 134a and 134b or in time, as illustrated by the tuples 136a and 136b to build the sequences of tuples. The grouping in time results in a first sequence of tuples 138, whereas the grouping in frequency results in the second sequence of tuples 140.

The sequences of tuples 138 and 140 are encoded using for example a Huffman codebook, resulting into two different sequences of code words 142 and 144. According to the present invention, the sequence of code words requiring the fewer number of bits, is finally transmitted to a decoder, that has to additionally receive a sequence indication, signaling whether time grouping or frequency grouping is underlying the sequence of code words. As can be seen in FIG. 2, for the shown example of adaptive grouping of pairs of parameters (2-dimensional), the sequence indication can consist of only one single bit.

Figure 3:
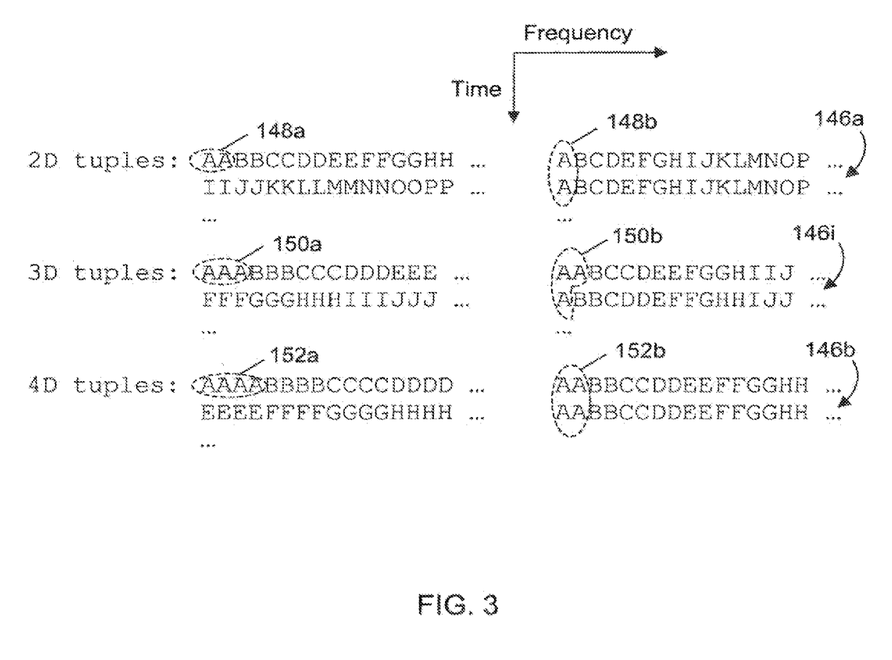
FIG. 3 shows some additional possibilities of adaptively grouping parameters.

FIG. 3 shows some alternative grouping strategies that can be used to implement the inventive adaptive grouping, allowing for Huffman codes with dimensions bigger than 2.

FIG. 3 shows a grouping strategy for a two-dimensional Huffman code 146a, for a three-dimensional Huffman code 146b and a for a four-dimensional Huffman code 146c. For each of the strategies two consecutive time frames are illustrated, wherein the parameters belonging to the same tuple are represented by the same capital letters.

In the case of the two-dimensional Huffman code the grouping is done as already illustrated in FIG. 2, building two-dimensional tuples in frequency 148a and in time 148b. In case of building tuples consisting of three parameters, the frequency tuples 158a are such, that three neighboring frequency parameters within one frame are grouped together to form a tuple. The time tuples 150b can be built such, that two neighboring parameters from one frame are combined with one parameter from the other frame, as is shown in FIG. 3.

Four-dimensional time grouped tuples 152a are built corresponding to the other time tuples by grouping four neighboring parameters of one frame into one tuple. The time grouping tuples 152b are built such, that two neighboring parameters of one frame are combined with two neighboring parameters of the other frame, wherein the parameter pairs of the single frames are describing the same spectral property of the two consecutive time frames.

Allowing different grouping schemes, as illustrated in FIG. 3, one can significantly reduce the bit rate of the side information, for example if one uses a variety of predefined Huffman codebooks of different dimensions, the dimension of the grouping can be varied within the encoding process such, that the representation resulting in the lowest bit rate can be used at any time within the encoding process.

Figure 4:
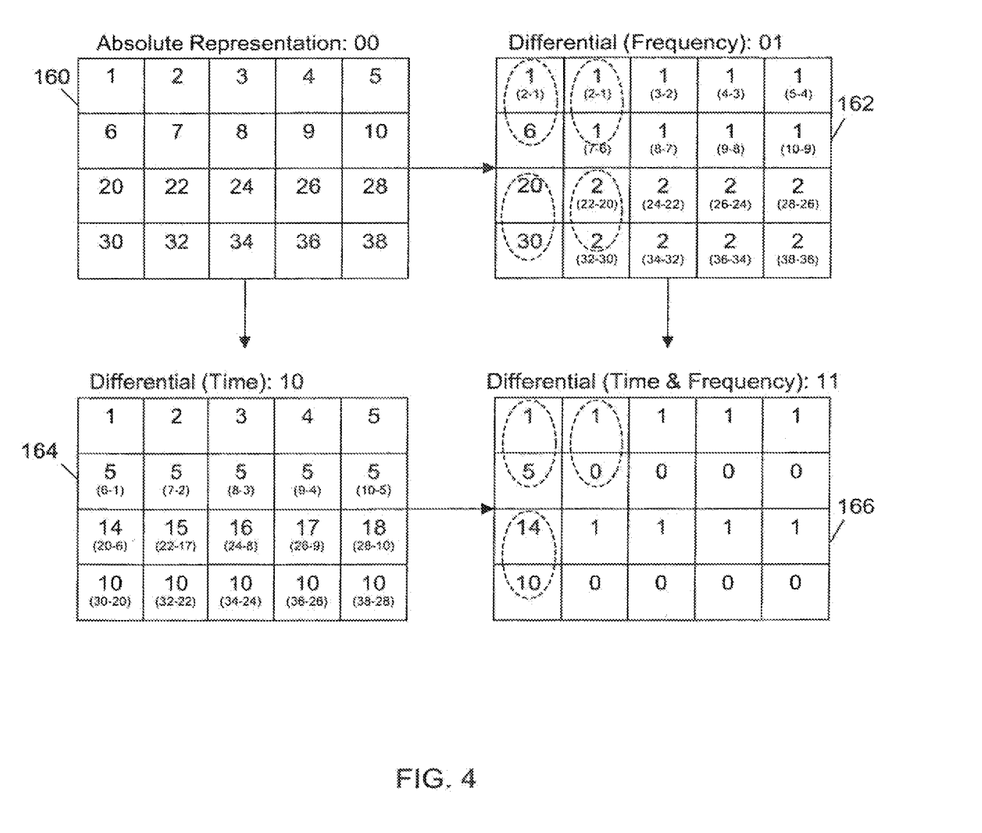
FIG. 4 shows differential encoding schemes.

FIG. 4 shows, how an inventive compression unit, that additionally comprises a differential encoder, can be used to further decrease the side information, by applying some differential encoding before the Huffman encoding process.

To illustrate the differential encoding in time and frequency or in time and frequency, the same absolute representation of parameters 160 that was already shown in FIG. 2, is used as a basis for the various differential encoding steps. The first possibility is to differentially encode the parameters of the absolute representation 160 in frequency, resulting in the differentially encoded parameters 162. As can be seen in FIG. 4, to differentially encode the absolute representation 160, the first parameter of each frame is left unchanged, whereas the second parameter is replaced by the difference of the second parameter and the first parameter of the absolute representation 160. The other parameters within the differentially encoded representation are built following the same rule.

Another possibility is the differential coding in time, yielding the representation 164. This representation is built by leaving the complete first frame unchanged, whereas the parameters of the following frames are replaced by the difference of the parameter of the absolute representation and the same parameter of the previous frame, as can be seen in FIG. 4.

A third possibility is to first encode differentially in frequency, followed by a differential encoding in time or vice versa, both resulting in the same encoded representation 166, that is differentially encoded in time and frequency.

It is to be noted, that one has the chance to use those four different representations of the original signal as input to the adaptive grouping. Having a look at the different representations 160 to 166 of the given example of parameters, one can clearly see how the differential encoding has impact on the transmitted rate of side information. Looking at the absolute representation 160, one recognizes, that neither a grouping in time nor in frequency would result in tuples having the same content. Therefore no appropriate Huffman codebook is constructable, that would assign the shortest code words to the tuples occurring most.

The case is different looking at the differentially in frequency encoded representation 162, where one could construct a Huffman codebook that only needs to have four entries to cover the full representation, and where either the tuple (1, 1) or the tuple (2, 2) would be assigned the code word with minimum length, to achieve a compact side information.

The advantage is less obvious in the representation being differentially encoded in time 164. Nonetheless one can gain also here, grouping in frequency and making use of the numerous tuples (5, 5) and (10, 10).

For the representation that is differentially encoded in time and in frequency 166, one would even achieve a further reduction of the side information bit rate than in the representation 162, since a grouping in time would result in a high multiplicity of the tuple (1, 0), as indicated in the figure, allowing to construct a Huffman codebook, that would assign the shortest code word to the previous tuple.

As can be clearly seen in FIG. 4, the high flexibility of the inventive concept making use of adaptive grouping and of differential encoding allows to choose the strategy that fits the original audio signal most, thus allowing to keep the side information bit rate low.

To summarize, in one preferred embodiment the quantized parameter values are first differentially encoded over time (variant 1) and differentially over frequency (variant 2). The resulting parameters can then be grouped adaptively over time (variant a) and frequency (variant b). As a result, four combinations are available (1a, 1b, 2a, 2b) from which the best is selected and signaled to the decoder. This could be done by a 2 bit information only, representing the variants 1a, 1b, 2a, 2b by, for example, the bit combination 00, 01, 10, 11.

Figure 5:
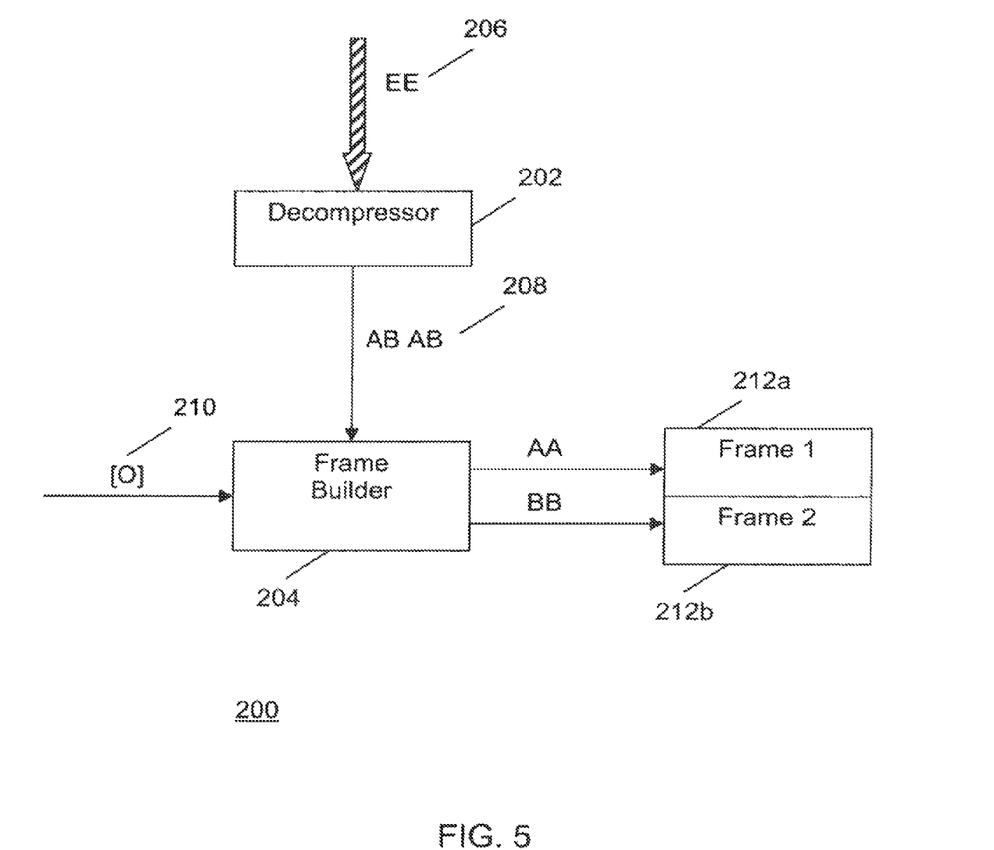
FIG. 5 shows an inventive decoder.
Figure 6:
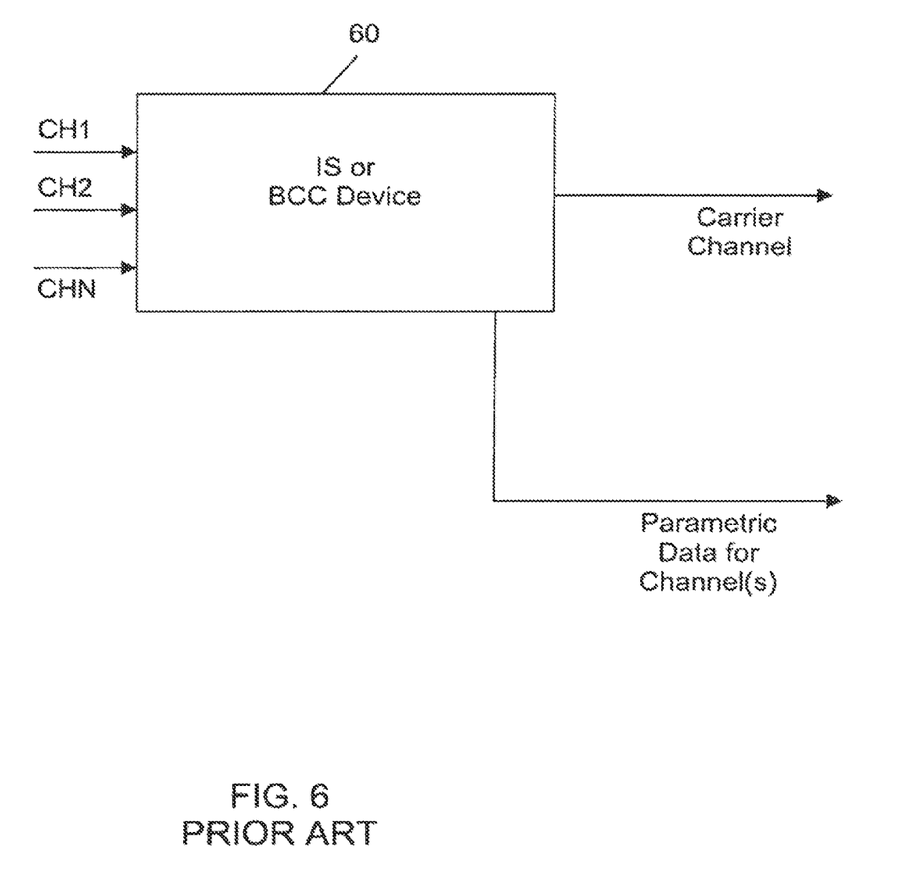
FIG. 6 shows a prior art multi-channel encoder.

FIG. 5 shows a decoder according to the current invention, to decode encoded blocks of parameters, wherein the block of parameters includes a first frame having a set of first spectral parameters and a second frame having a set of second spectral parameters.

The decoder 200 comprises a decompressor 202 and a frame builder 204. The decompressor receives on an input an encoded block of parameters 206. The decompressor derives, using a decoding rule, a sequence of tuples of parameters 208 from the encoded block of parameters 206. This sequence of tuples of parameters 208 is input into the frame builder 204.

The frame builder additionally receives a sequence indication 210, indicating what sequence of tuples have been used by the encoder to build the encoded block of parameters.

The frame builder 204 then reorders the sequence of tuples 208 steered by the sequence indication 210 to reconstruct the first frame 112a and the second frame 112b from the sequence of tuples of parameters 208.

Preferred embodiments of the present invention described above achieve a further enhancement of the coding efficiency by introducing adaptive grouping of values to be coded using a multi-dimensional Huffman code. As an example, both, two-dimensional grouping of values over frequency can be done as well as two-dimensional grouping of values over time. The encoding scheme would then do both types of encoding and choose the more advantageous one (i.e. the variant which requires less bits). This decision is signaled to the decoder via side information.

In further examples, as illustrated in FIG. 3, it is also possible to build higher-dimensional Huffman codes, applying different grouping strategies to build the tuples. The given examples show grouping strategies that build the tuples by grouping together parameters from two consecutive frames only. It is also possible to do the grouping using parameters from three or more consecutive frames, doing the grouping in a straightforward way.

In a modification of the inventive encoder, it is also possible to combine the differential grouping and the differential encoding strategies with the use of different Huffman codebooks to derive the shortest possible representation of the side information. This could further reduce the side information bit rate of an encoded audio signal at the cost of having additional side information parameters, signaling the Huffman codebook used for the encoding.

The described preferred embodiments of the present invention show the inventive concept for examples, where the grouping strategy does not change within two consecutive time frames. In a modification of the present invention it is of course also possible, to have multiple changes between the grouping in time and in frequency within a set of two frames, which would imply that the sequence indication is also supplied within the frames, to signal the change of grouping strategy.

In the given examples, the parameters are differentially encoded before being Huffman encoded. Of course every other lossless encoding rule is also possible prior to the Huffman encoding of the parameters, the aim of the encoding being to derive as much tuples with the same content as possible.

There are four different possible parameter representations given in FIG. 4, namely the absolute representation, the differential representation in frequency, the differential representation in time and the differential representation in time and frequency. To choose between four representations, the side information signaling which representation has been used, has to be at least two bits in size, as indicated in FIG. 4. To balance the win of a possible efficiency gain of the coding versus the additional spectral representation indication, one could of course also decide to principally allow only two possible representations, reducing the spectral representation indication to the length of a single bit.

As an example of an inventive decoder, FIG. 5 shows a decoder 200 that receives in addition to the encoded block of parameters 206 some side information. The side information steering the frame builder 204 only comprises a sequence indication 210 in the given example. A decoder according to the present invention can of course process any other side information required, especially a spectral representation indication, indicating the spectral representation that has been used to encode original frames.

Depending on certain implementation requirements of the inventive methods, the inventive methods can be implemented in hardware or in software. The implementation can be performed using a digital storage medium, in particular a disk, DVD or a CD having electronically readable control signals stored thereon, which cooperate with a programmable computer system such that the inventive methods are performed. Generally, the present invention is, therefore, a computer program product with a program code stored on a machine-readable carrier, the program code being operative for performing the inventive methods when the computer program product runs on a computer. In other words, the inventive methods are, therefore, a computer program having a program code for performing at least one of the inventive methods when the computer program runs on a computer.

While the foregoing has been particularly shown and described with reference to particular embodiments thereof, it will be understood by those skilled in the art that various other changes in the form and details may be made without departing from the spirit and scope thereof. It is to be understood that various changes may be made in adapting to different embodiments without departing from the broader concepts disclosed herein and comprehended by the claims that follow.

The invention claimed is:

1. A hardware implemented compression unit for compression of parameters, the parameters including a first set of parameters including a representation of a first portion of an original signal, the parameters further including a second set of parameters including a representation of a second portion of the original signal, the second portion neighboring the first portion, comprising:
   a supplier for supplying a first tuple and all remaining tuples of a first sequence of tuples using only tuples having parameters from one single set of parameters, and to supply a first tuple and all remaining tuples of a second sequence of tuples using only tuples having at least one parameter from the first set of parameters and at least one parameter from the second set of parameters;
   a bit estimator for estimating a number of bits necessary to encode the sets of parameters using the first sequence of tuples and to encode the sets of parameters using the second sequence of tuples, based on an encoding rule; and a provider for providing encoded blocks, the provider being operative to provide the encoded blocks using the sequence of tuples resulting in a lower number of bits, and for providing a single sequence indication for one encoded block indicating the sequence of tuples from which the encoded blocks are derived, wherein the original signal is an audio signal received by hardware; and wherein the tuples have a number of parameters, the number being at least two, and wherein an n-dimensional code is used for encoding the tuples, the number n of the dimension of the code being equal to the number of parameters of the tuples.

2. Compression unit in accordance with claim 1 in which the first and the second set of parameters are including a spectral representation of the first and the second portion of the original signal as representation.

3. Compression unit in accordance with claim 1, in which the first portion and the second portion of the original signal are neighbored in time or in space.

4. Compression unit in accordance with claim 1, in which the first set of parameters includes a representation of a first frame of the original signal and in which the second set of parameters includes a representation of a second frame of the original signal.

5. Compression unit in accordance with claim 1, in which the supplier is operative to supply the first tuple consisting of two parameters from a single set of parameters, the two parameters being neighbored parameters within the representation of the original signal; and the second tuple consisting of a first parameter from the first set of parameters and a second parameter from the second set of parameters, the first and the second parameter describing the same property of the original signal within the representation.

6. Compression unit in accordance with claim 1, in which the supplier is operative to supply the first tuple consisting of an integer multiple of two parameters from a single set of parameters, the parameters being neighbored parameters within the representation of the original signal; and the second tuple consisting of an two or more parameters from the first set of parameters, the parameters being neighbored within the representation of the original signal and of the same number of parameters from the second set of parameters, the parameters being neighbored within the representation of the original signal, the parameters from the first and the second set of parameters describing the same properties of the original signal within the representation.

7. Compression unit in accordance with claim 1, in which the supplier is operative to supply the first tuple consisting of an odd number of neighboring parameters of the representation of the original signal from one set of parameters; and the second tuple consisting of a majority of neighboring parameters of the representation of the original signal from one set of parameters and of a minority of neighboring parameters of the representation of the original signal from the other set of parameters, wherein the majority of parameters is alternately taken from the first and from the second set of parameters for consecutive tuples of the second sequence of tuples.

8. Compression unit in accordance with claim 1, in which the bit estimator is operative to encode, using the encoding rule, the first sequence of tuples to derive a first encoded block and to encode the second sequence of tuples to derive a second encoded block, and to estimate the necessary number of bits by counting the bits of the first and of the second encoded block; and in which the provider is operative to forward the first or the second encoded block, choosing the block with the lower number of bits.

9. Compression unit in accordance with claim 1, in which the bit estimator is operative to estimate the bits necessary to encode the sequences of tuples according to the encoding rule; and in which the provider is operative to encode the sequence of tuples providing the encoded block with the lower number of bits.

10. Compression unit in accordance with claim 1, in which the sets of parameters comprise a parametric representation of the audio signal.

11. Compression unit in accordance with claim 1, in which the encoding rule is such that encoding tuples having the same length but different parameters can result in codewords of different length.

12. Compression unit in accordance with claim 1, in which the parameters include BCC parameters describing a spatial interrelation between a first and a second original audio channel and in which the BCC parameters are chosen from the following list of BCC parameters:

interchannel coherence/correlation (ICC)
interchannel level difference (ICLD)
interchannel time difference (ICTD)
interchannel phase difference (IPD).

13. Compression unit in accordance with claim 1, further comprising a differential encoder for processing the original signal such that the first set of parameters and the second set of parameters include a difference representation, the difference being a difference in time, in frequency or in time and in frequency.

14. Compression unit in accordance with claim 13, in which the supplier is operative to supply a first group of tuples and a second group of tuples, the tuples within the groups of tuples having parameters from one of the following representations:

a differential representation in time, a differential representation in frequency, a differential representation in time and in frequency, and an absolute representation, wherein the first group of tuples is having tuples with two parameters from the first set of parameters and wherein the second group of tuples is having one parameter from the first and one parameter from the second set of parameters; and in which the bit estimator is operative to estimate the number of bits necessary to encode sequences of tuples for at least eight sequences of tuples, each sequence having one of the tuples of the groups of tuples; and in which the provider is operative to signal, in addition to the sequence indication, a representation indication indicating the representation resulting in the lower number of bits.

15. Compression unit in accordance with claim 14, in which the provider is operational to signal the sequence indication and the representation indication using a binary data word having at least three bits.

16. Compression unit in accordance with claim 1, in which the encoding rule is such that each tuple has associated therewith a single code word of a group of different code words.

17. Compression unit in accordance with claim 1, in which the encoding rule includes a Huffman codebook.

18. A hardware implemented decoder for decoding encoded blocks of parameters, the parameters including a first set of parameters including a representation of a first portion of an original signal, the parameters further including a second set of parameters including a representation of a second portion of the original signal, the second portion neighboring the first portion, and for processing a sequence indication, comprising:
   a decompressor, the decompressor being operative to decompress, using a decoding rule depending on an encoding rule used for encoding sequences of tuples, an encoded block of parameters to derive a sequence of tuples of parameters, each tuple having at least two parameters; and
   a frame builder for receiving the sequence indication, the sequence indication indicating a used sequence of tuples from a number of different sequences underlying the encoded block, and for building the sets of parameters depending on the sequence indication, such that the sets of parameters are built either
      by assigning all parameters within each tuple of the sequence of tuples to the first or to the second set of parameters; or
      by assigning at least a first parameter of each tuple of the sequence of tuples to the first set of parameters and at least a second parameter of each tuple of the sequence of tuples to the second set of parameters,
   wherein the original signal is an audio signal received by hardware; and
   wherein the tuples have a number of parameters, the number being at least two, and wherein an n-dimensional code is used for decoding the encoded tuples, the number n of the dimension of the code being equal to the number of parameters of the tuples.

19. Decoder in accordance with claim 18 in which the first and the second sets of parameters are including a spectral representation of the first and the second portion of the original signal as representation.

20. Decoder in accordance with claim 18, in which the first portion and the second portion of the original signal are neighbored in time or in space.

21. Decoder in accordance with claim 18, in which the first set of parameters includes a representation of a first frame of the original signal and in which the second set of parameters includes a representation of a second frame of the original signal.

22. Decoder in accordance with claim 18, in which the frame builder is operative to receive a single sequence indication for one encoded block of parameters, and to build the sets of parameters by using a sequence of tuples comprising only tuples of the type indicated by the sequence indication.

23. Decoder in accordance with claim 18, in which the frame builder is operative to build sets of parameters comprising a parametric representation of the audio signal.

24. Decoder in accordance with claim 18, in which the frame builder is operative to build sets of parameters comprising BCC parameters describing a spatial interrelation between a first and a second audio channel and in which the BCC parameters are chosen form the following list of BCC parameters:
   interchannel coherence/correlation (ICC)
   interchannel level difference (ICLD)
   interchannel time difference (ICTD)
   interchannel phase difference (IPD).

25. Decoder in accordance with claim 18, further comprising a differential decoder for receiving a representation indication and for processing the sets of parameters such that the parameters are derived from a difference spectral representation, the difference being a difference in time, in frequency or in time and in frequency, wherein the differential decoder is operative to process the first and the second set of parameters depending on the representation indication.

26. Decoder in accordance with claim 25, in which the frame builder and the differential decoder are operative to receive a sequence indication and a representation indication as a binary data word having at least three bits.

27. Decoder in accordance with claim 18, in which the decoding rule is such that each code word within the encoded block of parameters has associated therewith a single tuple of a group of different tuples.

28. A hardware-implemented method for compression of parameters, the parameters including a first set of parameters including a representation of a first portion of an original signal, the parameters further including a second set of parameters including a representation of a second portion of the original signal, the second portion neighboring the first portion, the method comprising:
   supplying, by a supplier, a first tuple and all remaining tuples of a first sequence of tuples using only tuples having parameters from one single set of parameters, and a first tuple and all remaining tuples of a second sequence of tuples using only tuples having at least one parameter from the first set of parameters and at least one parameter from the second set of parameters;
   estimating, by an estimator, a number of bits necessary to encode the sets of parameters using the first sequence of tuples and to encode the frames using the second sequence of tuples, based on an encoding rule; and
   providing, by a provider, encoded blocks using the sequence of tuples resulting in a lower number of bits and a single sequence indication for one encoded block indicating the sequence of tuples from which the encoded blocks are derived, wherein the method is performed by a hardware apparatus,
   wherein the original signal is an audio signal received by hardware; and
   wherein the tuples have a number of parameters, the number being at least two, and wherein an n-dimensional code is used for encoding the tuples, the number n of the dimension of the code being equal to the number of parameters of the tuples.

29. A hardware implemented method for decoding encoded blocks of parameters, the parameters including a first set of parameters including a representation of a first portion of an original signal, the parameters further including a second set of parameters including a representation of a second portion of the original signal, the second portion neighboring the first portion, and for processing a sequence indication, the method comprising:
   decompressing, by a decompressor, using a decoding rule depending on an encoding rule used for encoding sequences of tuples, the encoded block of parameters to derive a sequence of tuples of parameters, each tuple having at least two parameters;
   receiving, by a frame builder, the sequence indication indicating a used sequence of tuples from a number of different sequences underlying the encoded block; and
   building the sets of parameters, depending on the sequence indication such that the sets of parameters are built either by assigning all parameters within each tuple of the sequence of tuples to the first or to the second set of parameters; or by assigning at least a first parameter of each tuple of the sequence of tuples to the first set of parameters and at least a second parameter of each tuple of the sequence of tuples to the second set of parameters, wherein the original signal is an audio signal received by hardware; and wherein the tuples have a number of parameters, the number being at least two, and wherein an n-dimensional code is used for decoding the encoded tuples, the number n of the dimension of the code being equal to the number of parameters of the tuples.

30. Computer readable digital storage medium having stored thereon a computer program having a program code for performing, when running on a computer, a method for compression of parameters, the parameters including a first set of parameters including a representation of a first portion of an original signal, the parameters further including a second set of parameters including a representation of a second portion of the original signal, the second portion neighboring the first portion, the method comprising:

supplying a first tuple and all remaining tuples of a first sequence of tuples using only tuples having parameters from one single set of parameters, and a first tuple and all remaining tuples of a second sequence of tuples using only tuples having at least one parameter from the first set of parameters and at least one parameter from the second set of parameters; estimating a number of bits necessary to encode the sets of parameters using a first sequence of tuples including the first tuple and to encode the frames using a second sequence of tuples including the second tuple, based on an encoding rule; providing encoded blocks using the sequence of tuples resulting in a lower number of bits; wherein the original signal is an audio signal; and providing a single sequence indication for one encoded block indicating the sequence of tuples from which the encoded blocks are derived, wherein the tuples have a number of parameters, the number being at least two, and wherein an n-dimensional code is used for encoding the tuples, the number n of the dimension of the code being equal to the number of parameters of the tuples.

31. Computer readable digital storage medium having stored thereon a computer program having a program code for performing, when running on a computer, a method for decoding encoded blocks of parameters, the parameters including a first set of parameters including a representation of a first portion of an original signal, the parameters further including a second set of parameters including a representation of a second portion of the original signal, the second portion neighboring the first portion, and for processing a sequence indication, the method comprising:

decompressing using a decoding rule depending on an encoding rule used for encoding sequences of tuples, the encoded block of parameters to derive a sequence of tuples of parameters, each tuple having at least two parameters; receiving the sequence indication indicating a used sequence of tuples from a number of different sequences underlying the encoded block; and building the sets of parameters, depending on the sequence indication such that the sets of parameters are built either by assigning all parameters within each tuple of the sequence of tuples to the first or to the second set of parameters; or by assigning at least a first parameter of each tuple of the sequence of tuples to the first set of parameters and at least a second parameter of each tuple of the sequence of tuples to the second set of parameters, wherein the tuples have a number of parameters, the number being at least two, and wherein an n-dimensional code is used for decoding the encoded tuples, the number n of the dimension of the code being equal to the number of parameters of the tuples; wherein the original signal is an audio signal.

* * * * *